US010746763B2

(12) United States Patent
Jang et al.

(10) Patent No.: US 10,746,763 B2
(45) Date of Patent: Aug. 18, 2020

(54) APPARATUS AND METHOD FOR DIAGNOSING ELECTRIC POWER EQUIPMENT USING THERMAL IMAGING CAMERA

(71) Applicant: Korea Electric Power Corporation, Jeollanam-do (KR)

(72) Inventors: Kwang-Heung Jang, Daejeon (KR); Kang-Se Lee, Daejeon (KR); Byoun-Hun Jung, Daejeon (KR); Doc-Jun Byun, Daejeon (KR); Min-Hee Choi, Daejeon (KR); Yong-Woo Park, Seoul (KR)

(73) Assignee: Korea Electric Power Corporation, Naju-si, Jeollanam-do (KR)

( * ) Notice: Subject to any disclaimer, the term of this patent is extended or adjusted under 35 U.S.C. 154(b) by 228 days.

(21) Appl. No.: 15/755,906

(22) PCT Filed: Aug. 29, 2016

(86) PCT No.: PCT/KR2016/009585
§ 371 (c)(1),
(2) Date: Feb. 27, 2018

(87) PCT Pub. No.: WO2017/039259
PCT Pub. Date: Mar. 9, 2017

(65) Prior Publication Data
US 2018/0340962 A1    Nov. 29, 2018

(30) Foreign Application Priority Data

Aug. 31, 2015 (KR) .................. 10-2015-0122728

(51) Int. Cl.
*G01R 13/36* (2006.01)
*G01N 25/72* (2006.01)
(Continued)

(52) U.S. Cl.
CPC ............ *G01R 13/36* (2013.01); *G01J 5/0066* (2013.01); *G01J 5/0096* (2013.01); *G01N 25/72* (2013.01);
(Continued)

(58) Field of Classification Search
CPC ....... G01J 5/0096; G01J 5/0066; G01N 25/72
See application file for complete search history.

(56) References Cited

U.S. PATENT DOCUMENTS 5,713,666 A * 2/1998 Seelin .................. G01J 5/0003
374/121
9,893,538 B1 * 2/2018 Bell ........................ H02J 50/60
(Continued)

FOREIGN PATENT DOCUMENTS

| JP | H05-332962 | 12/1993 |
| JP | 2000-258584 A | 9/2000 |

(Continued)

OTHER PUBLICATIONS

International Search Report dated Dec. 28, 2016 issued in International Patent Application No. PCT/KR2016/009585 (with English translation).

(Continued)

*Primary Examiner* — Alvaro E Fortich
(74) *Attorney, Agent, or Firm* — Morgan, Lewis & Bockius LLP

(57) ABSTRACT

Disclosed are an apparatus and method for diagnosing electric power equipment. The apparatus includes a measuring unit including a pan/tilt module mounted on the top of a vehicle and an imaging module mounted on an upper portion of the pan/tilt module, a determination unit for determining whether electric power equipment is detected by the measuring unit, a controller for performing control to capture a thermal image of the electric power equipment (Continued)

using the measuring unit, and a processing unit for dividing the thermal image into an analysis target equipment region, a non-interest equipment region, and a background noise region through pattern analysis of the thermal image and diagnosing the electric power equipment as being normal or as being abnormal on the basis of temperature information included in the analysis target equipment region.

19 Claims, 17 Drawing Sheets

(51) Int. Cl.
*G01J 5/00* (2006.01)
*G01R 31/12* (2020.01)
(52) U.S. Cl.
CPC ... *G01J 2005/0077* (2013.01); *G01R 31/1218* (2013.01)

(56) References Cited

U.S. PATENT DOCUMENTS

2011/0280597 A1* 11/2011 Shimura .............. G01R 19/165
399/37
2014/0168445 A1* 6/2014 Hogasten ............. H04N 5/2257
348/164
2015/0156407 A1* 6/2015 Wang ....................... H04N 5/33
348/164
2015/0220044 A1* 8/2015 Tatsumoto ................ H02J 3/38
307/43

FOREIGN PATENT DOCUMENTS

| | | | |
|---|---|---|---|
| JP | 2001-108758 | A | 4/2001 |
| JP | 2002-156347 | A | 5/2002 |
| JP | 2006-119110 | A | 11/2006 |
| KR | 10-0844961 | B1 | 7/2008 |
| KR | 10-2010-0034086 | A | 4/2010 |
| KR | 10-1348088 | B1 | 1/2014 |
| KR | 10-1417765 | B1 | 7/2014 |
| KR | 10-2015-0019401 | A | 2/2015 |
| KR | 10-2015-0021619 | A | 3/2015 |

OTHER PUBLICATIONS

Japanese Office Action dated Feb. 5, 2019 issued in Japanese Patent Application No. 2018-510934.

* cited by examiner

APPARATUS AND METHOD FOR DIAGNOSING ELECTRIC POWER EQUIPMENT USING THERMAL IMAGING CAMERA

CROSS REFERENCE

This patent application is the U.S. National Phase under 35 U.S.C. § 371 of International Application No. PCT/KR2016/009585, filed on Aug. 29, 2016, which claims the benefit of Korean Patent Application No. 10-2015-0122728, filed on Aug. 31, 2015, the entire contents of each are hereby incorporated by reference.

TECHNICAL FIELD

The present invention relates generally to an apparatus and method for diagnosing electric power equipment using a thermal imaging. More particularly, the present invention relates to an apparatus and method for capturing a thermal image of electric power equipment using a thermal imaging camera mounted on a vehicle and diagnosing abnormalities in the electric power equipment based on the thermal image.

BACKGROUND ART

With electric power equipment operated under high voltage, environmental, mechanical, thermal, and electrical deterioration is inevitable due to complex causes, thereby resulting in electrical abnormalities in the electric power equipment. For example, such electrical abnormalities cause surface cracks, erosion tracking, increased leakage current, heat, ultrasonic sound, light, and mechanical vibrations in the equipment, and when this status continues, electric breakdown occurs, finally resulting in malfunctioning of the equipment. Conventionally, in order to prevent this bad result, various kinds of devices such as an infrared camera, an optical camera, an ultrasonic device, a high-frequency device, a partial discharge device, and a very low frequency (VLF) device have been used for diagnosis of electrical abnormalities in electric power equipment.

The diagnostic methods described above are based on the fundamental principle that that all objects emit infrared radiation energy from the surface thereof at temperatures above absolute temperature (−273° C.). Here, the infrared camera operates on the principle that it converts radiant energy generated from an object into temperature data and displays the temperature data as a visualized infrared thermal image. The thermal image consists of much temperature data (for example, 307,200 temperature raw data in the case of 640×480 pixel resolution) depending on the resolution, unlike a general optical image.

A thermal imaging camera (also called an infrared camera) can remotely detect the radiation in a non-contact diagnostic manner, visually express the diagnosis result in the form of temperature data, and display the results in real time. Accordingly, the infrared camera can immediately determine the deterioration state of equipment attributable to a defect or fault in the equipment. Therefore, the infrared camera is effectively utilized in monitoring and diagnosing the status of the electric power equipment.

In such an electric power equipment diagnosis method, a diagnosis is usually performed in a manner that a person drives a vehicle while holding a portable infrared thermal camera in his/her hand, stops the vehicle in front of a special high voltage electric pole that is a diagnosis target, captures and stores a thermal image of the diagnosis target, and then drives the vehicle to the next diagnostic target. However, this diagnosis method has a disadvantage of taking much time for diagnosis. Therefore, this method enables diagnosis on electric power equipment only at about 400 places per day, per person. Further, although some power equipment is diagnosed by using a simple diagnosis device mounted on a vehicle, there is a problem that it takes much time to diagnose electric power equipment at every single place because storing a captured image is not performed during traveling of the vehicle but performed in a stationary state of the vehicle.

In addition, in order to analyze whether or not the electric power equipment is deteriorated, the analyst individually manually analyzes the images one by one using an existing analysis program dedicated to each manufacture's infrared cameras. Therefore, there are many cases where deteriorated points cannot be identified due to differences in the level of analytical technique of the analysts, and the analysis time is long because the images are analyzed manually one by one.

In this regard, it is disclosed in Korean Patent Application Publication No. 2015-0021619 (titled: automatic apparatus for inspecting insulator using thermal image).

DISCLOSURE

Technical Problem

An objective of the present invention is to provide an apparatus and method for diagnosing electric power equipment using a thermal imaging camera, the apparatus and method being capable of automatically analyzing a thermal image and accurately diagnosing the electric power equipment as being normal or as being abnormal.

Technical Solution

In order to accomplish the above objective, the present invention provides an apparatus for diagnosing electric power equipment, the apparatus including: a measuring unit including a pan/tilt module mounted to a top surface of a vehicle and an imaging module mounted on an upper portion of the pan/tilt module; a determination unit for determining whether electric power equipment is detected by the measuring unit; a controller for performing control to capture a thermal image of the electric power equipment using the measuring unit; and a processing unit for performing pattern analysis on the thermal image of the electric power equipment to divide the thermal image into an analysis target equipment region to undergo analysis, a non-interest equipment region not to undergo analysis, and a background noise region, and for diagnosing the electric power equipment as being normal or as being abnormal based on temperature information included in the analysis target equipment region.

The processing unit may generate a histogram based on temperature information included in the thermal image, classify the histogram into three histogram sub-regions based on a preset equipment temperature range, and binarizes the thermal image based on the three histogram sub-regions to perform pattern classification.

The processing unit may analyze the histogram in order from a higher temperature region to a lower temperature region to classify the three histogram sub-regions.

The processing unit may classify a first area of the thermal image as the non-interest equipment region, the first area having a temperature value above the preset equipment temperature range.

The processing unit may classify a second area of the thermal image as the background noise region, the second area having a temperature value under the equipment temperature range.

The processing unit may set an actual equipment temperature by deriving a temperature corresponding to the largest number of pixels within the histogram sub-region of the analysis target equipment region, and set a span temperature range by adding or subtracting a preset span temperature value to and from the actual equipment temperature.

The span temperature range may be divided into a plurality of temperature levels, and the processing unit may display the analysis target equipment region in different colors according to the respective temperature levels.

The processing unit may determine whether the electrical power equipment is normal or abnormal based on the equipment temperature according to a predetermined criterion.

The apparatus for diagnosing electric power equipment, according to one embodiment of the present invention, may further include a position tracking unit for tracking position information of the vehicle, in which the processing unit can diagnose each piece of a plurality of pieces of electric power equipment installed on a plurality electric poles, using information on each of the electric poles, which is preliminarily prepared and stored.

The measuring unit may further include a temperature and humidity measurement module for measuring an air temperature and an ambient humidity.

In order to accomplish the objective of the present invention, according to another aspect, there is provided a method of diagnosing electric power equipment, the method including: by a determination unit, determining whether or not electric power equipment is detected by a measuring unit including a pan/tilt module mounted on a top surface of a vehicle and an imaging module mounted on an upper portion of the pan/tilt module; by a controller, capturing a thermal image of the electric power equipment using the measuring unit when it is determined that the electric power equipment is detected; by a processing unit, classifying a plurality of regions of the thermal image into an analysis target equipment region, a non-interest equipment region, and a background noise region by performing pattern analysis on the thermal image; and by the processing unit, diagnosing the electric power equipment as being normal or as being abnormal, based on temperature information included in the analysis target equipment region.

The classifying of the plurality of regions of the thermal image into the analysis target equipment region, the non-interest equipment region, and the background noise region may include: generating a histogram of temperature distribution based on temperature information included in the thermal image; classifying regions of the histogram into three histogram sub-regions by using a preset equipment temperature range as a reference value; and binarizing the thermal image based on the three histogram sub-regions.

The classifying of the regions of the histogram into three histogram sub-regions may be performed by analyzing the histogram in order of temperature from a high temperature region to a low temperature region.

In the classifying of the plurality of regions of the thermal image into the analysis target equipment region, the non-interest equipment region, and the background noise region, a region having a temperature value above the equipment temperature range among the plurality of regions of the thermal image may be classified as the non-interest equipment region.

In the classifying of the plurality of regions of the thermal image into the analysis target equipment region, the non-interest equipment region, and the background noise region, a region having a temperature value below the equipment temperature range among the plurality of regions of the thermal image may be classified as the background noise region.

The diagnosing of the electric power equipment may include: deriving a temperature corresponding a color of pixels that most frequently occur in the histogram sub-region of the analysis target equipment region; setting the derived temperature as an actual equipment temperature; and setting a span temperature range by adding and subtracting a preset span temperature value to and from the actual equipment temperature.

The span temperature range may be divided into a plurality of temperature levels, and the method of diagnosing the electric power equipment may further include a process in which the processing unit displays the analysis target equipment region in different colors according to the respective temperature levels on a display unit.

The diagnosing of the electric power equipment may determine whether the electric power equipment operates normally or abnormally based on the actual equipment temperature according to a predetermined determination criterion.

The method of diagnosing electric power equipment, according to the present invention, may further include tracking position information of the vehicle by using a position tracking unit, in which the diagnosing of the electric power equipment as being normal or as being abnormal may be performed for each piece of electric power equipment among a plurality of pieces of electric power equipment mounted on a plurality of electric poles based on information on the plurality of electric poles, which is preliminarily prepared and stored.

Advantageous Effects

As described above, with the electric power equipment diagnosis apparatus and method using a thermal imaging camera, according to the present invention, it is possible to automatically diagnose electric power equipment as being normal or as being abnormal. Furthermore, it is possible to continuously perform the diagnosis even while a vehicle to which the electric power equipment diagnosis apparatus is mounted is traveling, which results in reduction of diagnosis time. Still furthermore, it is possible to improve accuracy of diagnosis on an abnormality in electric power equipment through pattern analysis.

In addition, the electric power equipment diagnosis apparatus and method using a thermal imaging camera, according to the present invention, are achieved through intensive study, research, and development of a technology of a system incorporating an algorithm capable of automatically analyzing a huge amount of data of thermal images in a short time. Therefore, with the electric power equipment diagnosis apparatus and method using a thermal imaging camera, according to the present invention, it is possible to dramatically shorten analysis time and prevent human errors by eliminating human intervention during analysis, in comparison with a conventional method in which a lot of thermal images are manually analyzed one by one by specialists. Moreover, it is possible to accurately identify abnormal electric power equipment and to automatically produce an analysis report as a result of the diagnosis.

MODE FOR INVENTION

Figure 1:
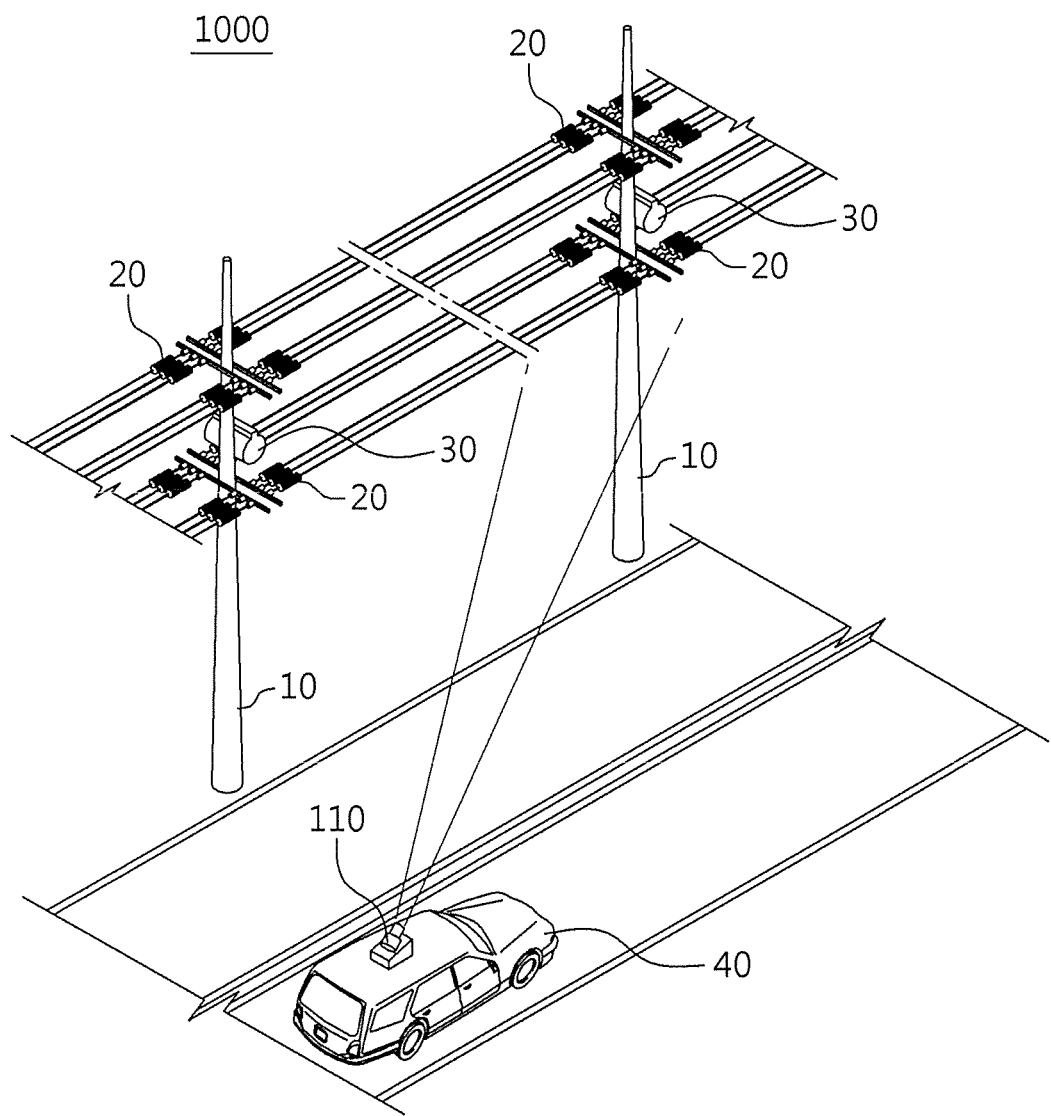
FIG. 1 is a conceptual diagram of an electric power equipment diagnosis system according to one embodiment of the present invention.

The present invention will be described in detail below with reference to the accompanying drawings. Repeated descriptions and descriptions of known functions and configurations which have been deemed to unnecessarily obscure the gist of the present invention will be omitted below. The embodiments of the present invention are intended to fully describe the present invention to a person having ordinary knowledge in the art to which the present invention pertains. Accordingly, the shapes, sizes, etc. of components in the drawings may be exaggerated to make the description clearer.

FIG. 1 is a conceptual diagram of an electric power equipment diagnosis system 1000 according to one embodiment of the present invention. The electric power equipment diagnosis system 1000 according to one embodiment of the present invention captures a thermal image of electric power equipment 20 using a measuring unit 110 mounted on a vehicle 40 and diagnoses operation status of electric power equipment based on the thermal image. This diagnostic process can be performed regardless of whether the vehicle is moving or stationary.

Specifically, the electric power equipment diagnosis system 1000 according to one embodiment of the present invention features that the measuring unit 110 mounted to the top of the vehicle automatically detects the electric power equipment 20 and captures a thermal image of the detected electric power equipment 20. Hereinafter, an electric power equipment diagnosis apparatus 100 according to one embodiment of the present invention will be described with reference to FIG. 2.

Figure 2:
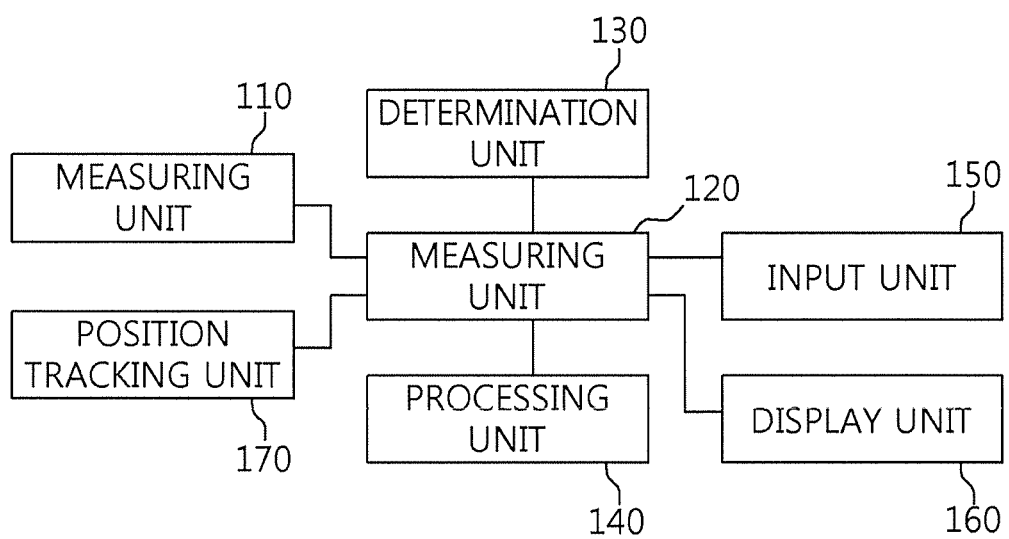
FIG. 2 is a block diagram of an electric power equipment diagnosis apparatus according to one embodiment of the present invention.

FIG. 2 is a block diagram of the electric power equipment diagnosis apparatus 100 according to one embodiment of the present invention. As illustrated in FIG. 2, the electric power equipment diagnosis apparatus 100 according to one exemplary embodiment of the present invention includes the measuring unit 110, a controller 120, a determination unit 130, a processing unit 140, an input unit 150, a display unit 160, and a position tracking unit 170. Hereinafter, each of the above components included in the electric power equipment diagnosis apparatus 100 according to one embodiment of the present invention will be described.

First, the measuring unit 110 is mounted on the top surface of a vehicle, and has a function of capturing a thermal image of electric power equipment. For this purpose, the measuring unit 110 may include a pan/tilt module mounted on the top surface of the vehicle and an imaging module mounted on the pan/tilt module. The imaging module can be rotated up and down and pivoted left and right by the pan/tilt module. The imaging module may include, for example, an infrared thermal camera and a charge-coupled device (CCD) camera. In a general situation, the infrared thermal camera is used to capture a thermal image of electric power equipment. However, when it is required to examine the exterior of electric power equipment for cracks, crevices, or other damages, which are difficult to be identified from a thermal image, the CCD camera is used to capture an optical image.

In general, electric power equipment is located about 20 to 30° on the left side and 40 to 50° above when viewed in the road direction in which the vehicle travels. Therefore, a presetting function of the pan/tilt module may be effectively used to help the measuring unit capture an image of electric power equipment. Further, an image capturing time preset by using the presetting function may be set differently depending on the speed of the vehicle.

The measuring unit 110 may further include an infrared illumination module. In the case where an ordinary visible light illumination lamp is used, the visible light wavelengths with strong intensity emitted from the visible light illumination module are likely to disturb or disrupt vehicles or houses in front of the vehicle equipped with the measuring unit. With the presence of the infrared illumination module, the measuring unit 110 according to the present embodiment of the invention can secure good visibility around electric power equipment during a nighttime inspection or diagnosis.

The measuring unit 110 may further include a temperature and humidity measurement module for measuring air temperature and ambient humidity.

The position tracking unit 170 estimates the position information of the vehicle. For example, the position tracking unit 170 may include a Global Positioning System (GPS). As described above, the electric power equipment diagnosis apparatus 100 according to one embodiment of the present invention captures a thermal image of electric power equipment using the measuring unit 110 mounted on the vehicle that is running or stationary, and performs diagnosis based on the thermal image. However, since there are millions of pieces of electric poles equipped with electric power equipment nationwide in most countries, it is not easy to manage the many pieces of electric power equipment scattered nationwide even if accurate diagnosis can be made for each piece of electric power equipment. For this reason, the power equipment diagnosis apparatus 100 according to one embodiment of the present invention is configured to communicate with or connect to an external system having a storage unit in which diagnostic information is stored. Therefore, the electric power equipment diagnosis apparatus 100 can have access to diagnostic information on target electric power equipment to be diagnosed, while distinguishing it from others based on preliminarily prepared and stored information on electric poles equipped with electric power equipment, and can perform diagnosis and store the results of diagnosis for each piece of electric power equipment. In addition to the method of mapping the electric poles and the respective pieces of electric power equipment to identify the target electric power equipment to be diagnosed as described above, there is another approach. That is, it is possible to identify the target electric power equipment based on GPS coordinates included in the captured thermal images of the electric power equipment.

The input unit 150 may include a joystick used for manual operation of the pan/tilt module, for example, for rotating or pivoting the pan/tilt module upward, downward, leftward, and rightward, and a three-axis adjusting device including a button which is operated to store the captured thermal image.

The determination unit 130 determines whether or not the electric power equipment is detected by the measuring unit 110.

When it is determined that the electric power equipment is detected, the controller 120 performs control to capture a thermal image of the electric power equipment using the measuring unit 110.

The processing unit 140 diagnoses the power equipment imaged in the thermal image as being normal or as being abnormal by performing pattern analysis on the thermal image. Specifically, the processing unit 140 divides the thermal image into three image regions: an analysis target equipment region in which target electric power equipment to be diagnosed is present; a non-interest equipment region in which no target electric power equipment to be diagnosed is present; and a background noise region. Then, the processing unit 140 diagnoses the electric power equipment as being normal or as being abnormal, based on temperature information included in the analysis target equipment region. Specifically, the following diagnosis procedure is performed by the processing unit 40.

Figure 3:
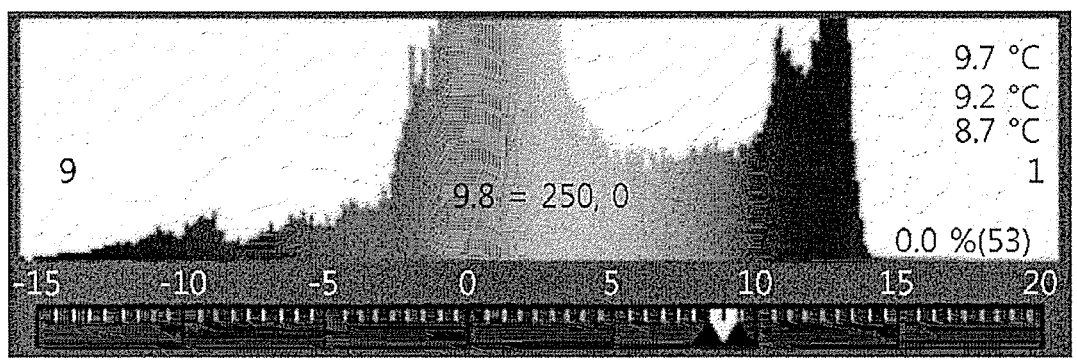
FIG. 3 is a view illustrating an example of a histogram generated by the electric power equipment diagnosis apparatus of the present invention.

First, the processing unit 140 performs a histogram analysis on the thermal image. Here, an exemplary histogram generated by the processing unit 140 is illustrated in FIG. 3. In FIG. 3, the x-axis represents the temperature bands and the y-axis represents the number of pixels. That is, as illustrated in FIG. 3, the processing unit 140 may count the number of pixels for each temperature band and represents the pixel distribution in the form of a histogram. However, it is not easy to distinguish between the surrounding background region and the electric power equipment region only by using the histogram.

Therefore, the processing unit 140 performs a scan operation on the histogram at predetermined temperature intervals to distinguish the surrounding background region from the electric power equipment to be diagnosed. The infrared thermal image is scanned for each temperature band (for example, there are 256 bands) in which a bandwidth of the temperature is specified by the user. Then, the pixel distribution per temperature band is calculated and the temperature of each region is determined. Here, the temperature band may be determined depending on a preset equipment temperature range. That is, with reference to the preset equipment temperature range that is a range of temperatures which are likely to be measured from electric power equipment, the thermal image is divided into three regions: a first region where the temperature value calculated from the thermal image is within the preset equipment temperature range and this region is called an analysis target equipment region; a second region where the temperature value calculated from the thermal image exceeds the preset equipment temperature range and this region is called a non-interest equipment region; and a third region where the temperature value calculated from the thermal image is below the preset equipment temperature range and this region is called a background noise region. Here, the reason for dividing the thermal image into three regions is that the thermal image inevitably includes the background in which clouds or the like are present, besides regions in which a plurality of pieces of electric power equipment is present. It is also intended to distinguish non-interest equipment, for example, a lamp, a transformer, or the like, from interest equipment (diagnosis target equipment) described below.

Next, the processing unit 140 binarizes the thermal image in order to simplify the classification of the regions. In the binarization process, the thermal image is scanned at predetermined temperature intervals by the processing unit 140, and each resultant scanned image is composed of a white region representing a region having temperatures within the temperature band set for the scanning, and a black region representing a region having temperatures outside the temperature band set for the scanning. Through this process, binary images are generated by the processing unit 40 and exemplary binary images are illustrated in FIGS. 4A to 4E.

Figure 4A:
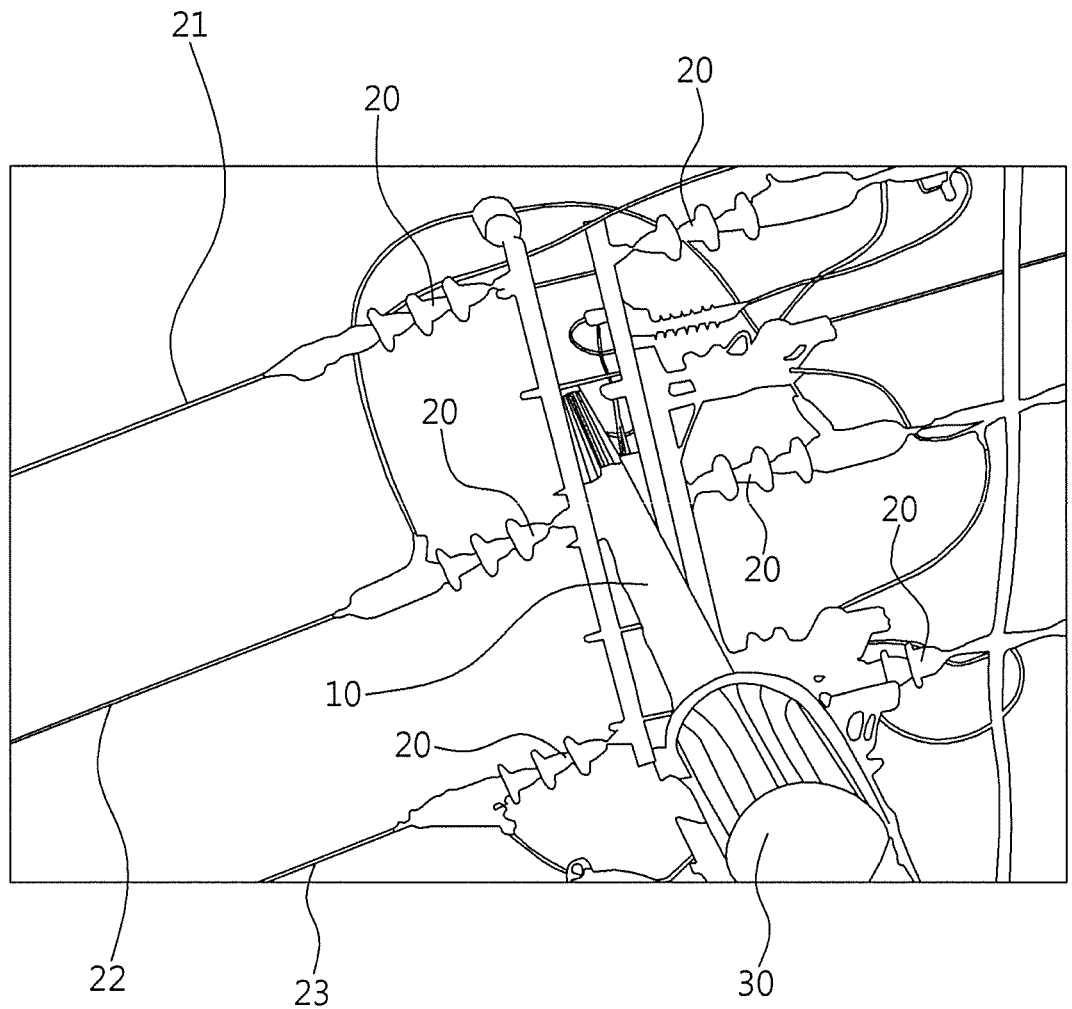
FIGS. 4A to 4E are views illustrating exemplary binary images generated by the electric power equipment diagnosis apparatus of the present invention.

FIG. 4A illustrates an example of a binary image of electric power equipment imaged by the measuring unit 110 of the electric power equipment diagnosis apparatus 100 according to one embodiment of the present invention. That is, in the example described below, as illustrated in FIG. 4A, the captured image of the electric power equipment includes an electric pole 10, a plurality of insulators 20 fitted over the electric pole 10, and a transformer 30 besides analysis target electric power equipment.

Figure 4B:
Figure 4C:
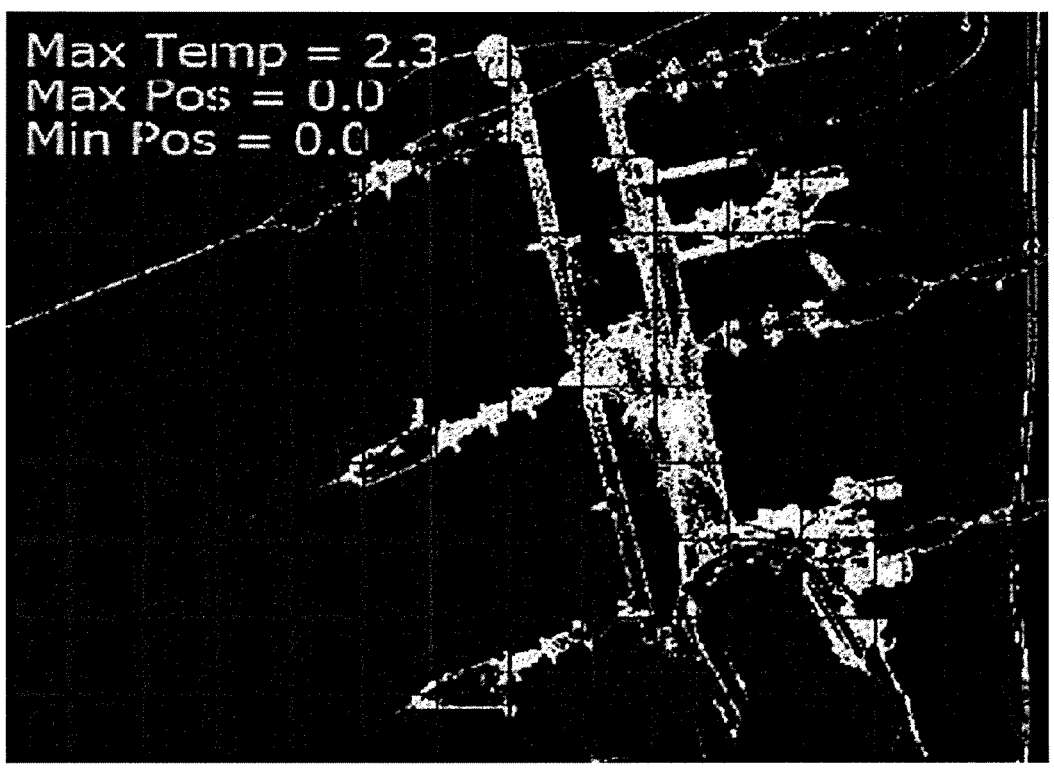
Figure 4D:
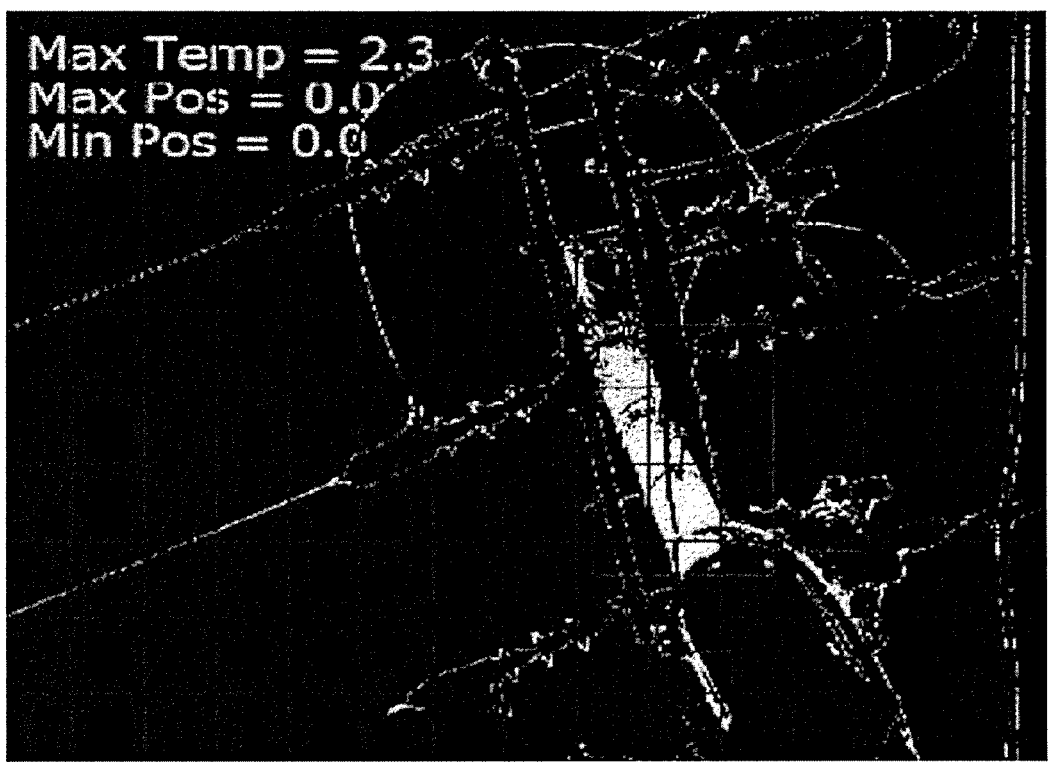
Figure 4E:
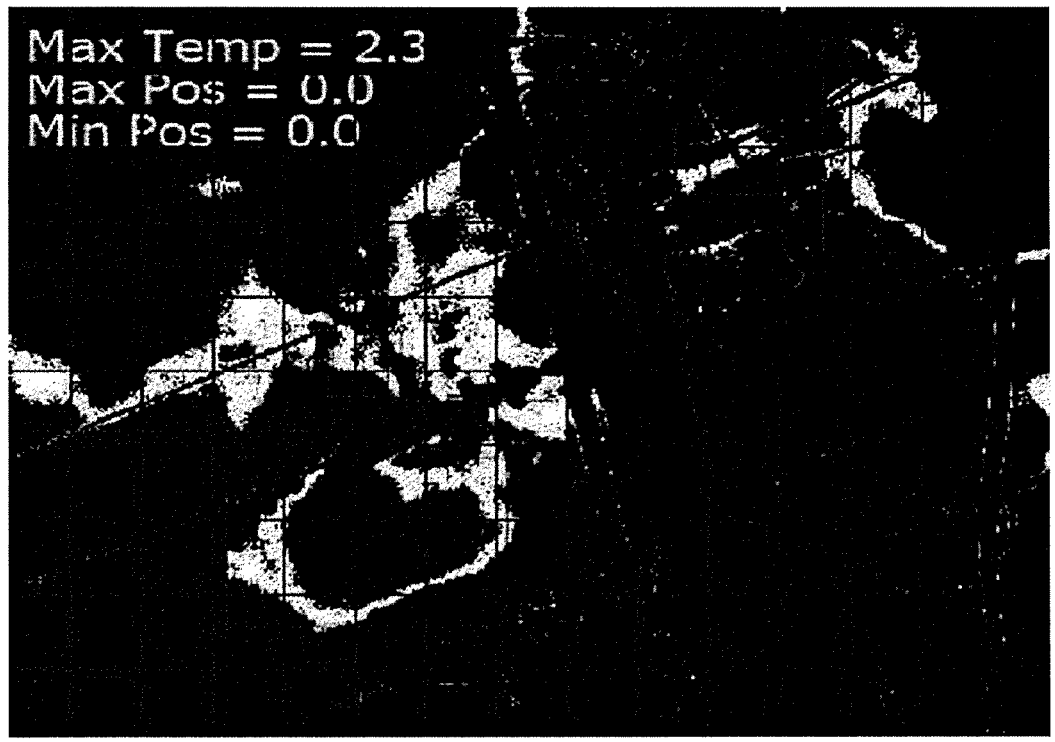

Thereafter, the histogram analysis is performed on the thermal image by the processing unit 140. Through the histogram analysis, the images illustrated in FIGS. 4B to 4E are generated. Here, FIG. 4B is a binary image representing a non-interest equipment region (corresponding to, for example, a transformer, a lamp, etc.) distinguished by the processing unit 140. FIGS. 4C and 4D are binary images representing analysis target equipment regions distinguished by the processing unit 140. FIG. 4E is a binary image of the background noise region. That is, as illustrated in FIG. 4B, the transformer 30 having a relatively higher temperature than other pieces of electric power equipment can be distinguished, and the background noise region can be distinguished as illustrated in FIG. 4E. Here, the background noise region of FIG. 4E may be an image of clouds or the like captured in the thermal image although it is not illustrated in FIG. 4A.

That is, the processing unit 140 classifies patterns of objects in the thermal image into: a pattern of a high temperature region including non-interest equipment (for example, a transformer, a lamp, etc.); and a pattern of target equipment; and a pattern of a background noise region (corresponding to, for example, low-temperature sky, clouds, and the like) by performing the scanning of the thermal image at the predetermined temperature intervals and the binarization process as described above. In general, when measuring a temperature during nighttime in a situation in which there is no outdoor background noise (for example, heat leakage from a heated building during winter), the patterns of objects are generated from a thermal image in order of a high temperature region (non-interest equipment such as a transformer, a lamp, etc.), an analysis target equipment region (including buildings, trees, and, the like), and a low temperature region (background noise region, for example, cold sky, clouds, and the like). By using this technique, only the patterns of intended objects (analysis target objects) to be diagnosed may be used for analysis, and unnecessary patterns (representing non-interest objects such as buildings, trees, street lamps, etc.) can be eliminated.

Thereafter, the processing unit 140 may perform grid analysis on the above-described binary image. Specifically, the processing unit 140 generates templates for abnormal patterns from the binary images and normalizes the abnormal patterns, thereby performing grid separation. Then, when reference conditions (criteria) for extraction of analysis target objects, based on temperature differences, are provided, separation of analysis target objects is performed. Next, abnormally heated parts are searched for and the temperature analysis is performed on the abnormally heated parts.

Figure 5A:
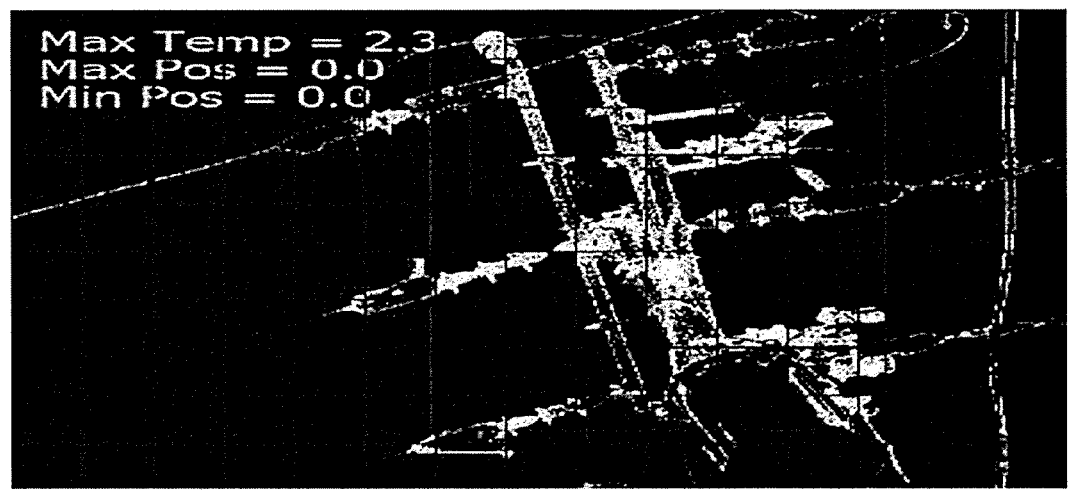
FIGS. 5A and 5B are views illustrating exemplary grid separation images generated by the electric power equipment diagnosis apparatus of the present invention.
Figure 5B:

FIGS. 5A and 5B are diagrams used to perform grid analysis for determining the distribution of electric power equipment by dividing the image of the electric power equipment illustrated in FIG. 4 at regular intervals. Here, FIG. 5A illustrates a grid separation image of electric power equipment that is an analysis target, and FIG. 5B illustrates a grid separation image representing the background noise such as a cloud that is not an analysis target and is thus to be eliminated. In the measurement of electric power equipment, equipment and clouds occupy the largest portion in the image. Therefore, the equipment to be diagnosed can be found by analyzing the connectivity and the changes between the previous and subsequent scanned images among the images separated through the grid analysis.

Figure 6A:
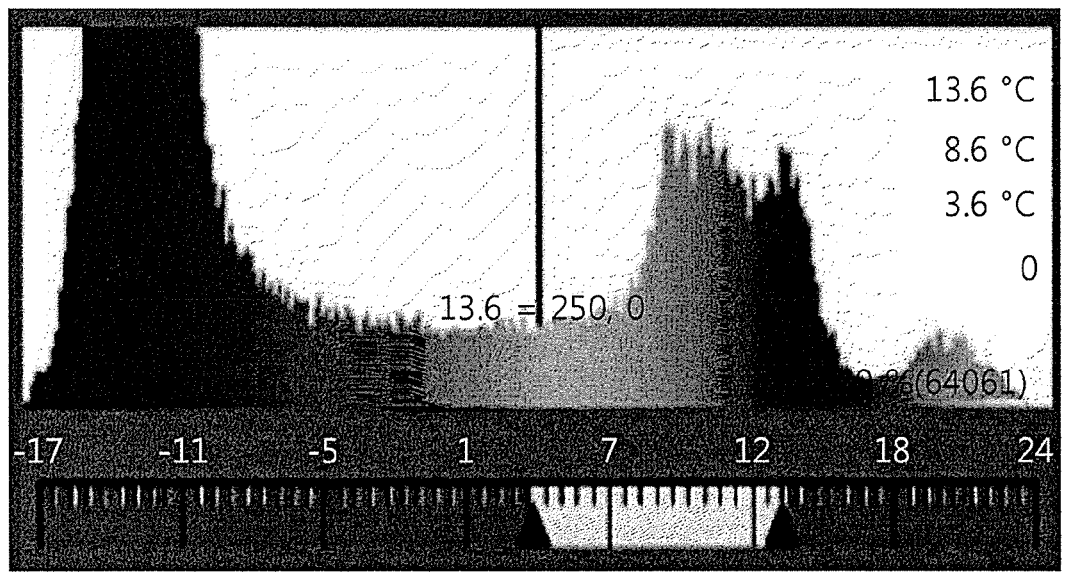
FIG. 6A and FIG. 6B are views used to describe an example of a method of adjusting a span temperature range using the electric power equipment diagnosis apparatus of the present invention.
Figure 6B:
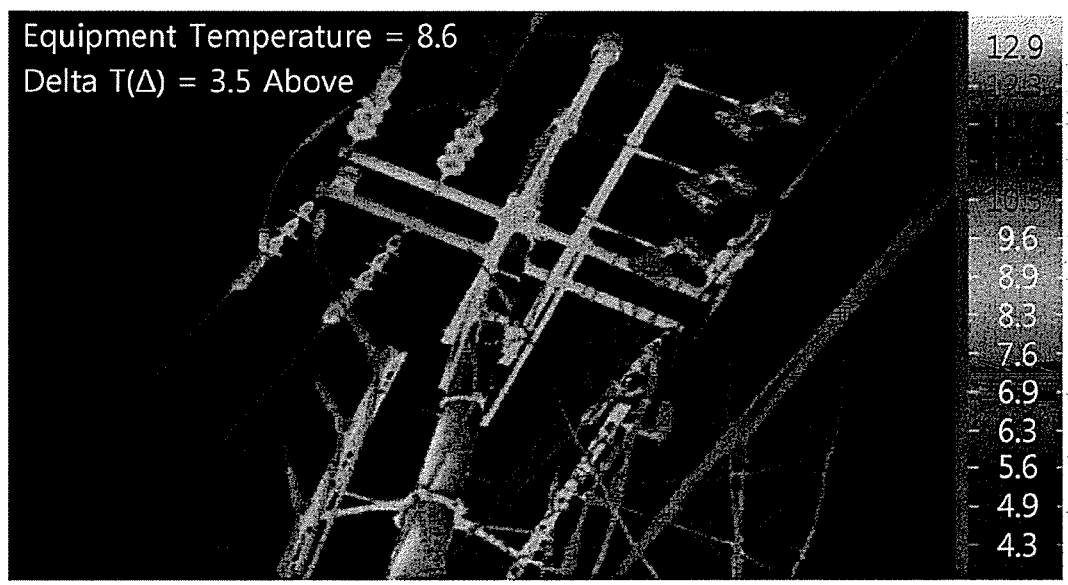

Next, the processing unit 140 detects the pattern of the electric power equipment to be analyzed among the patterns that are classified through the above-described processes, derives a temperature corresponding to the largest number of pixels distributed in the binarization pattern, and sets this derived temperature as an actual equipment temperature. Then, the processing unit 140 sets a span temperature range by adding and subtracting a preset span temperature value to and from the obtained equipment temperature. Here, the span temperature range may be set to about 5° C. around the equipment temperature in order to enable easy visual discrimination by naked eye. Here, it is preferable that the span temperature range is not broad but narrow. This is because when the span temperature range is narrow, it is possible to express even a small temperature difference with different colors. Therefore, it is possible to easily visually identify a color difference representing a temperature difference meaning an abnormality in equipment. FIGS. 6A and 6B are exemplary images showing that the equipment is abnormal after the span temperature range is adjusted in this way. As illustrated in FIG. 6B, the span temperature range is divided into a plurality of temperature levels. Accordingly, the processing unit 140 can display the analysis target equipment area in different colors according to the respective temperature levels via the display unit 160.

Alternatively, in order to obtain the surface temperature of the member of the electric power equipment, the temperature information measured by the temperature and humidity measurement module included in the measuring unit 140 may be used to adjust the measuring performance of the imaging module (for example, the thermal imaging camera). That is, it is possible to automatically adjust the span temperature range and the interval of the temperature levels according to the temperature change by using the outdoor temperature and humidity values.

The processing unit 140 can provide a temperature difference between normal electric power equipment and abnormal electric power equipment. As described above, the processing unit 140 performs analysis only on the target electric power equipment region, excluding the background noise region and the non-interest equipment region from the thermal image. The processing unit 140 may set the minimum temperature as the reference temperature among the temperatures of the analysis target electric power equipment, obtains the highest temperature that is measured from an abnormally heated portion, and provides a temperature difference between them.

Figure 7A:
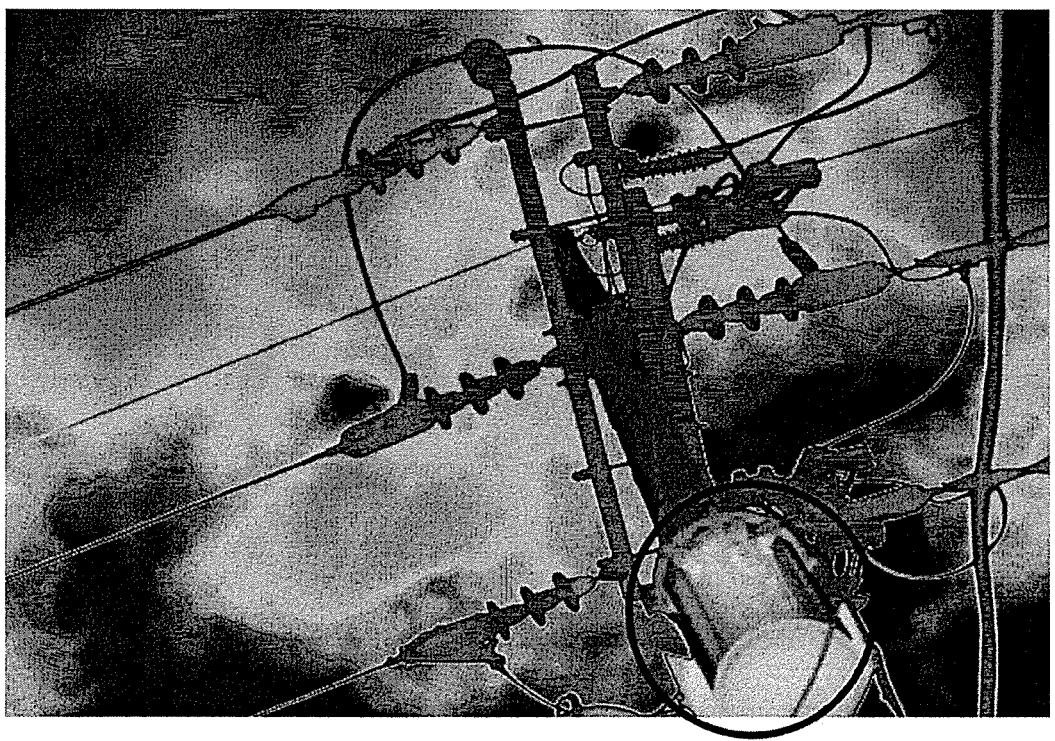
FIGS. 7A to 7F are views used to describe an example of a method of detecting a no-interest equipment region not to undergo diagnosis, using the electric power equipment diagnosis apparatus of the present invention.
Figure 7B:
Figure 7C:
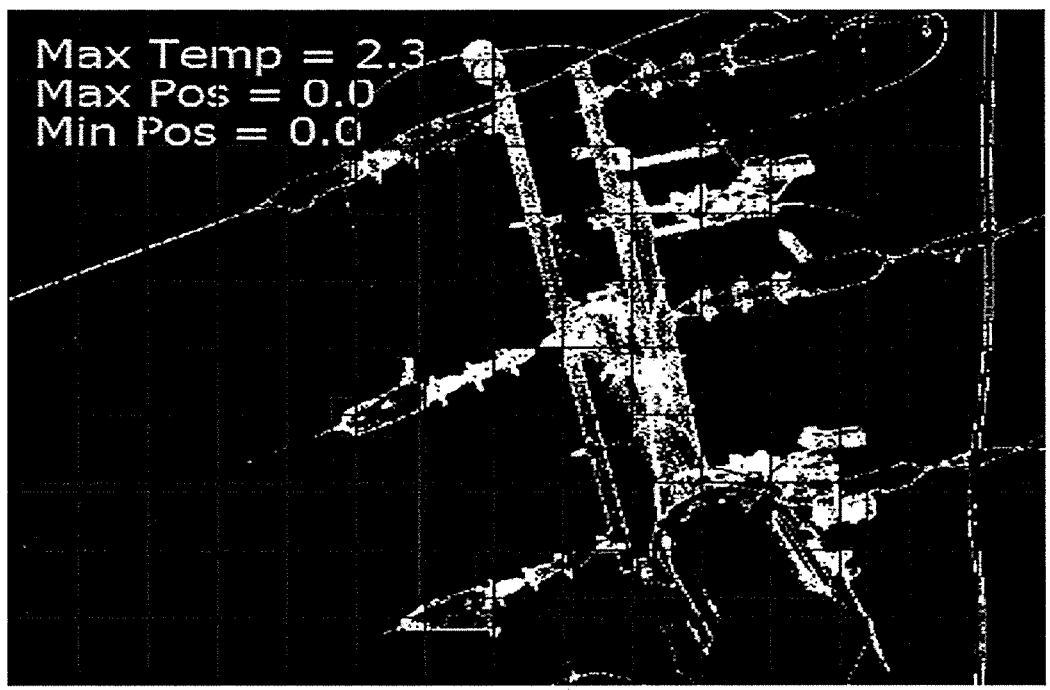
Figure 7D:
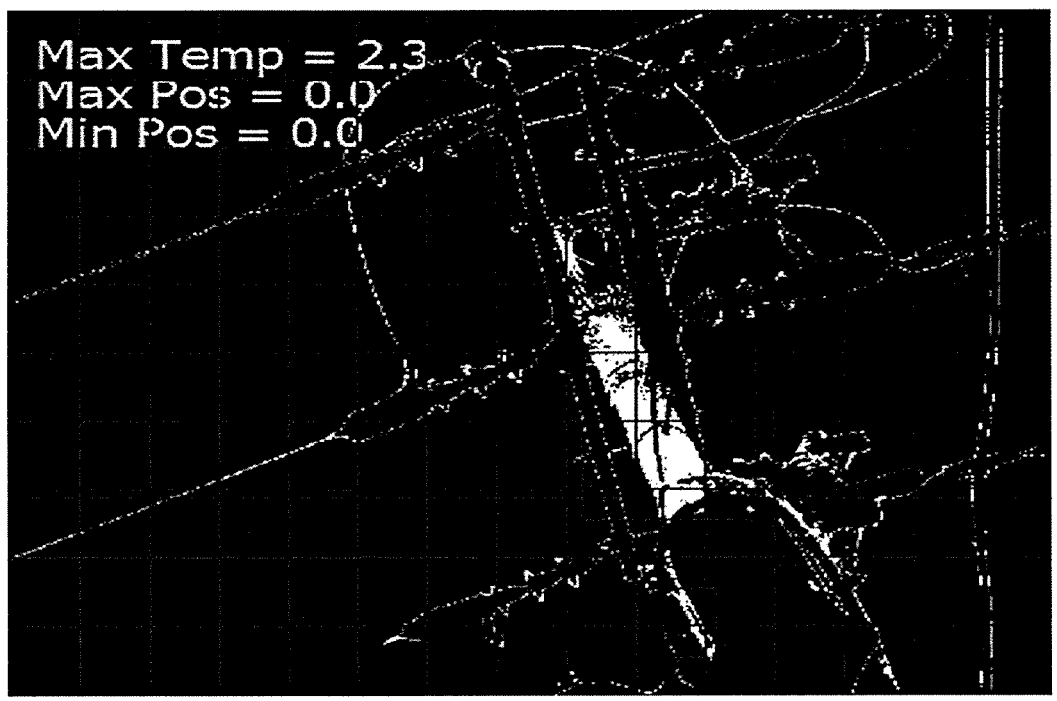
Figure 7E:
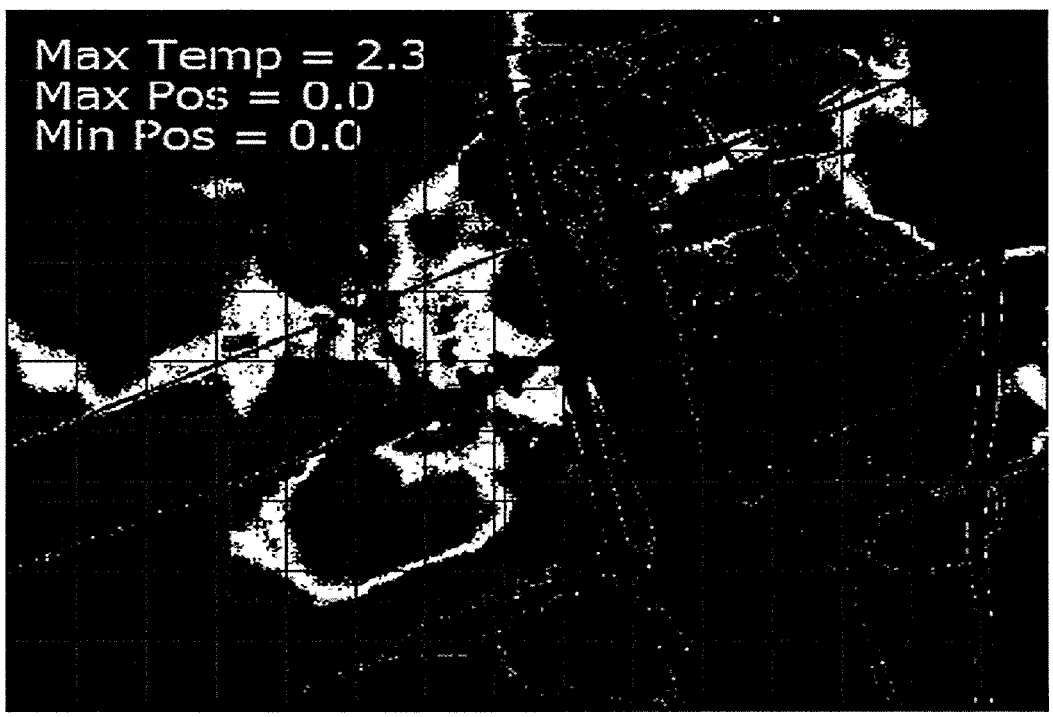
Figure 7F:
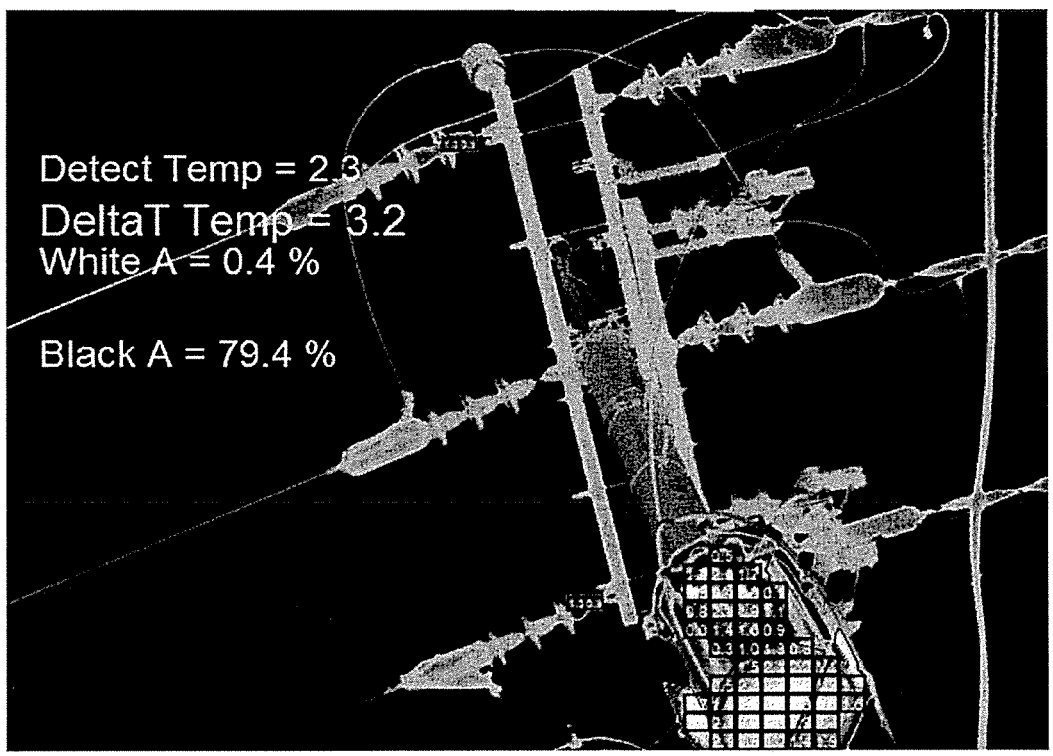

As described above, the processing unit 140 features that it performs diagnosis on electric power equipment in a manner of extracting only the analysis target equipment region by excluding the non-interest equipment region and the background noise region from the thermal image, and adjusting the span temperature range of the analysis target equipment region. That is, from the original thermal image illustrated in FIG. 7A, a high temperature region (representing a transformer, a street lamp, and the like) illustrated in FIG. 7B is excluded, and only the analysis target equipment region is extracted as illustrated in FIG. 7C. In addition, non-interest equipment, which is not an analysis target object, and background noise such as clouds and the like are distinguished as illustrated in FIGS. 7D and 7E. Thus, only the target equipment to be analyzed is extracted as illustrated in FIG. 7F. In addition, the span temperature is adjusted for diagnosis of abnormal equipment.

In addition, the processing unit 140 can perform diagnosis for each piece of electric power equipment installed on a plurality of electric poles by identifying an analysis target piece, based on the information on the plurality of electric poles, which is preliminarily obtained using GPS information and stored. In addition, the processing unit 140 can perform the process of adding associated GPS information to each thermal image and displaying the GPS information-added thermal image to the user.

Figure 8:
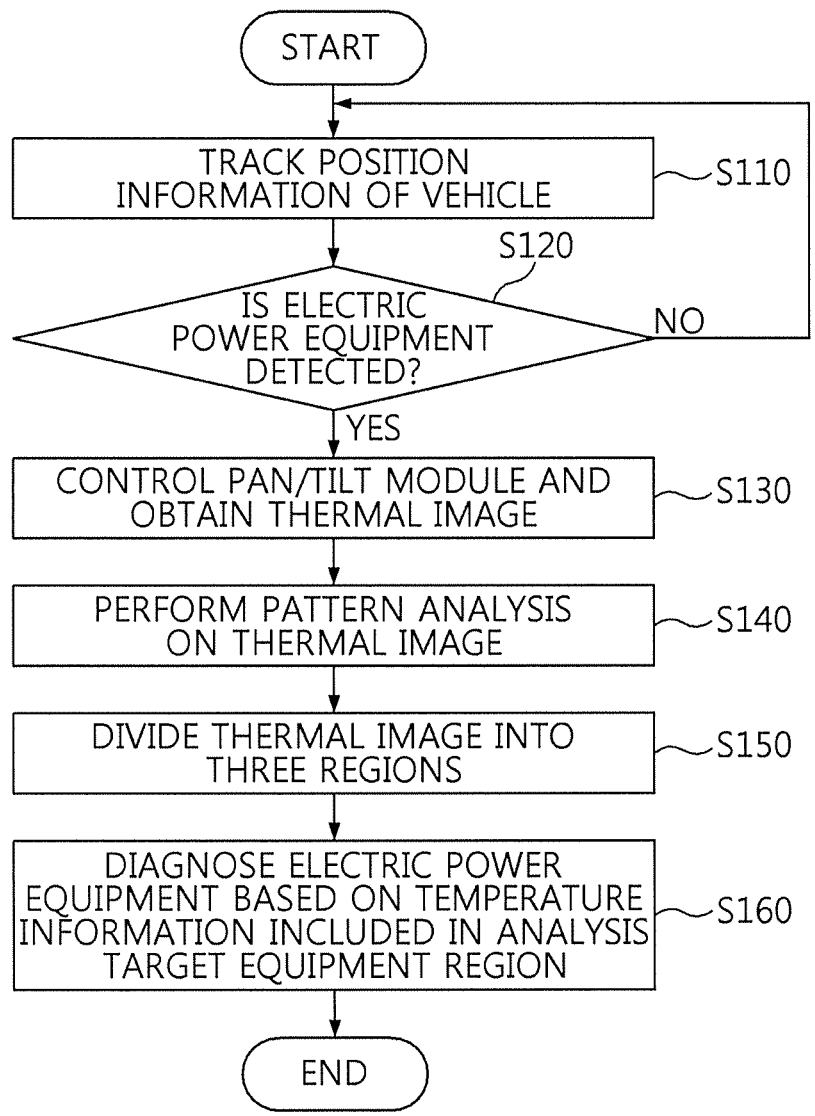
FIG. 8 is a flowchart illustrating a method of diagnosing electric power equipment, according to one exemplary embodiment of the present invention.

FIG. 8 is a flowchart illustrating a method of diagnosing electric power equipment according to one embodiment of the present invention. Hereinafter, a method of diagnosing electric power equipment, according to one embodiment of the present invention, will be described with reference to FIG. 8. Herein, the same elements or components as those described above will not be repeatedly described.

First, in Step S110, tracking the position information of a vehicle is performed. As described above, since there are millions of pieces of electric power equipment nationwide in many countries, it is important to perform diagnosis by distinguishing the pieces of electric power equipment from each other. Accordingly, the present invention is characterized in that the position information of the vehicle is tracked and GPS image information is added to thermal images as described below.

Thereafter, in Step S120, a determination unit determines whether any piece of electric power equipment is detected by a measuring unit. Here, the measuring unit may include a pan/tilt module mounted on the top surface of the vehicle and an imaging module mounted on the pan/tilt module. When it is determined that a piece of electric power equipment is detected in Step S120, control proceeds to Step S130. Otherwise, the control returns to Step S110, and the above-described steps are performed again.

In Step S130, the pan/tilt module is controlled so that the imaging module can capture an image of the detected electric power equipment, thereby generating a thermal image thereof.

Thereafter, pattern analysis is performed on the thermal image by a processing unit in Step S140, and the thermal image is classified into three regions in Step S150. Here, an analysis method performed in Step S140 has been described above in detail in connection with FIGS. 2 to 7, and will be further described below with reference to FIG. 9. Therefore, a description thereof will be omitted here.

The three regions referred to in Step S150 include an analysis target equipment region, a non-interest equipment region, and a background noise region. Here, the analysis target equipment region represents an area corresponding the target electric power equipment to be diagnosed, the non-interest equipment region represents an area corresponding objects such as a transformer, an illumination lamp, and the like which are to be filtered out, and the background noise region represents an area corresponding to clouds, sky, and the like which are also to be filtered out. The division of these three regions can be made based on the temperature information included in the thermal image as described above. That is, a region in which the temperature value exceeds an equipment temperature range in the thermal image is classified as the non-interest equipment region, an area in which the temperature value is below the equipment temperature range in the thermal image is classified as the background noise region, and a region in which the temperature value is within the equipment temperature range is classified as the analysis target equipment region.

Thereafter, the processing unit diagnoses an abnormality of the electric power equipment based on the temperature information included in the analysis target equipment region in Step S160. Here, the diagnosis of the electric power equipment as being normal or as being abnormal can be made based on a predetermined determination criterion that is set using the temperature information.

Figure 9:
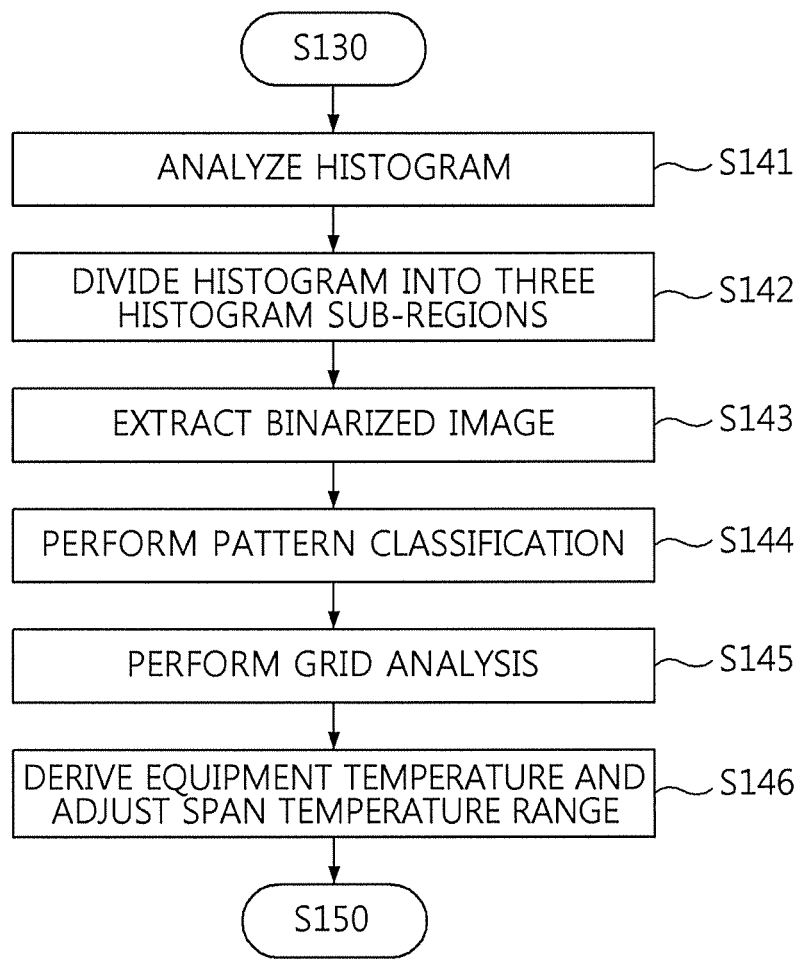
FIG. 9 is a flowchart of a process of analyzing a thermal image, according to one embodiment of the present invention.

FIG. 9 is a flowchart of a pattern analysis method for a thermal image according to one embodiment of the present invention. Hereinafter, Step S140 of FIG. 8 will be described with reference to FIG. 9. In the following description, a duplication of a description of elements, steps, procedures, or the like overlapping with those described above will be omitted.

First, in Step S141, a histogram of temperature information is generated from data of the thermal image.

Next, in Step S142, the histogram is divided into three histogram sub-regions based on a preset equipment temperature range. As described above, the three histogram sub-regions represent the analysis target equipment region, the non-interest equipment region, and the background noise region, respectively. These regions have been described in detail above, so that a further description thereof is omitted. The distinction of these regions can be made by analyzing the histogram in order of temperatures from a higher temperature to a lower temperature.

Thereafter, in Step S143, the thermal image is binarized based on three histogram sub-regions divided from the histogram. Here, the binarization refers to a method of expressing an image which is scanned at a predetermined temperature interval by the processing unit, as an image consisting of a white area and a black area. The white area represents regions having temperatures within the scanning temperature band, and the black area represents regions having temperatures outside the scanning temperature band.

Next, pattern classification is performed on the binary image in Step S144. Next, a grid analysis is performed on the binary image in Step S145. Since the processes performed in Steps S144 and S145 are described in detail above, a further description thereof will be omitted here.

Next, a temperature corresponding to the largest number of pixels in the histogram sub-region for the analysis target equipment region is derived and the derived temperature is set as an equipment temperature. By adding and subtracting a predetermined span temperature value to and from the equipment temperature, a span temperature range is set in Step S146. Here, the span temperature range may be divided into a plurality of temperature levels. Therefore, the electric power equipment within the analysis target equipment region is displayed on a display unit in different colors according to the respective temperature levels.

As described above, an optimal embodiment has been disclosed in the drawings and specification. Although specific terms have been used herein, they are used only for illustrative purposes and are not intended to limit the scope of the invention defined in the claims. Therefore, those skilled in the art can understand that various modifications and equivalents thereof are possible without departing from the scope of the present invention. Accordingly, the true scope of the present invention should be determined by the technical idea of the appended claims.

Also, as used in the specification, the term "part", "unit", or "module" may mean a software component or a hardware component and implement a certain function. However, the term "part", "unit", or "module" is not meant to be limited to software or hardware. The term "part", "unit", or "module" may be configured to reside on an addressable storage medium or may be configured to operate one or more processors.

The invention claimed is:

1. An apparatus for diagnosing electric power equipment, the apparatus comprising:
   an imaging unit including a pan/tilt module mounted to an upper surface of a vehicle and an image sensor mounted on an upper portion of the pan/tilt module, the imaging unit being configured to capture a thermal image of the electric power equipment, the pan/tilt module being configured to rotate and/or pivot the image sensor; and
   a processor configured to:
   determine whether electric power equipment is detected by the imaging unit,
   control the imaging unit to capture a thermal image of the electric power equipment, and
   perform pattern analysis on the thermal image to divide the thermal image into an analysis target equipment region, a non-interest equipment region, and a background noise region, and diagnosing the electric power equipment as being normal or as being abnormal based on temperature information included in the analysis target equipment region.

2. The apparatus set forth in claim 1, wherein the processor is further configured to generate a histogram based on temperature information included in the thermal image, classify regions of the histogram into three histogram sub-regions using a preset equipment temperature range as a reference, and binarize the thermal image based on the three histogram sub-regions, thereby performing pattern classification.

3. The apparatus as set forth in claim 2, wherein classifying the three histogram sub-regions is performed by analyzing the histogram in order of temperature from a higher temperature to a lower temperature.

4. The apparatus as set forth in claim 2, wherein the processor is further configured to classify a region having a temperature exceeding the preset equipment temperature range in the thermal image as the non-interest equipment region.

5. The apparatus as set forth in claim 2, wherein the processor is further configured to classify a region having a temperature below the preset equipment temperature as the background noise region.

6. The apparatus as set forth in claim 2, wherein the processor is further configured to derive a temperature corresponding to the largest number of pixels in the histogram sub-region for the analysis target equipment region as an equipment temperature, and sets a span temperature range by adding and subtracting a preset span temperature value to and from the equipment temperature.

7. The apparatus as set forth in claim 6, wherein the span temperature range is divided into a plurality of temperature levels, and the processor is configured to display, via a display, the analysis target equipment region in different colors according to the respective temperature levels.

8. The apparatus as set forth in claim 6, wherein the processor is further configured to diagnose the electric power equipment as being normal or as being abnormal based on the equipment temperature according to a predetermined determination criterion.

9. The apparatus as set forth in claim 1, further comprising a positioning system configured to estimate and track a position of the vehicle, wherein the processor is further configured to diagnose for each piece of electric power equipment among a plurality of pieces of electric power equipment installed on a plurality of electric poles, based on information on the electric poles, which is preliminarily prepared and stored.

10. The apparatus as set forth in claim 1, wherein the imaging unit further comprises a temperature and humidity sensor configured to measure air temperature and ambient humidity.

11. A method of diagnosing electric power equipment, the method comprising:
    determining whether electric power equipment is detected by an imaging unit including a pan/tilt module mounted on an upper surface of a vehicle and an image sensor mounted on an upper portion of the pan/tilt module, the imaging unit being configured to capture a thermal image of the electric power equipment, the pan/tilt module being configured to rotate and/or pivot the image sensor;
    controlling the imaging unit to capture a thermal image of the electric power equipment when the electric power equipment is determined as being detected;
    dividing, by a processor, the thermal image into an analysis target equipment region, a non-interest equipment region, and a background noise region by performing pattern analysis on the thermal image; and
    diagnosing, by the processor, the electric power equipment as being normal or as being abnormal based on temperature information included in the analysis target equipment region.

12. The method as set forth in claim 11, wherein the dividing the thermal image into an analysis target equipment region, a non-interest equipment region, and a background noise region comprises:
    generating a histogram based on temperature information included in the thermal image;
    classifying regions of the histogram into three histogram sub-regions based on a preset equipment temperature range; and
    binarizing the thermal image based on the three histogram sub-regions.

13. The method as set forth in claim 12, wherein the classifying regions of the histogram into three histogram sub-regions comprises:
    analyzing the histogram in, order of temperature from a higher temperature to a lower temperature.

14. The method as set forth in claim 12, wherein the dividing the thermal image into an analysis target equipment region, a non-interest equipment region, and a background noise region comprises:
    classifying a region having a temperature exceeding the preset equipment temperature range in the thermal image as the non-interest equipment region.

15. The method as set forth in claim 12, wherein the dividing the thermal image into an analysis target equipment region, a non-interest equipment region, and a background noise region comprises:
    classifying a region having a temperature below the preset equipment temperature range as the background noise region.

16. The method as set forth in claim 12, wherein the diagnosing the electric power equipment as being normal or as being abnormal comprises:
    deriving a temperature corresponding to the largest number of pixels in the histogram sub-region for the analysis target equipment region as an equipment temperature; and
    setting a span temperature range by adding and subtracting a preset span temperature value to and from the equipment temperature.

17. The method as set forth in claim 16, wherein the span temperature range is divided into a plurality of temperature levels, and the processing unit displays the analysis target equipment region in different colors according to the respective temperature levels via a display unit.

18. The method as set forth in claim 16, wherein the diagnosing the electric power equipment as being normal or as being abnormal comprises:
    determining whether the electric power equipment is normal or abnormal based on the equipment temperature according to a predetermined determination criterion.

19. The method as set forth in claim 11, further comprising: by a positioning system configured to estimate and track a position of the vehicle, wherein the diagnosing the electric power equipment as being normal or as being abnormal is performed by distinguishing each piece of electric power equipment from, other pieces of electric power equipment among a plurality of pieces of electric power equipment installed on a plurality of electric poles, based on information on the electric poles, which is preliminarily prepared and stored.

* * * * *